United States Patent
Chi

(10) Patent No.: US 9,064,554 B2
(45) Date of Patent: Jun. 23, 2015

(54) DATA INPUT/OUTPUT CIRCUIT AND SEMICONDUCTOR MEMORY DEVICE INCLUDING THE SAME

(71) Applicant: SK hynix Inc., Icheon-si Gyeonggi-do (KR)

(72) Inventor: Sung Soo Chi, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 71 days.

(21) Appl. No.: 14/027,610

(22) Filed: Sep. 16, 2013

(65) Prior Publication Data

US 2014/0177366 A1 Jun. 26, 2014

(30) Foreign Application Priority Data

Dec. 20, 2012 (KR) .................. 10-2012-0150087

(51) Int. Cl.
*G11C 7/00* (2006.01)
*G11C 7/10* (2006.01)
*G11C 11/4076* (2006.01)
*G11C 11/4096* (2006.01)
*G11C 7/12* (2006.01)
*G11C 11/4091* (2006.01)
*G11C 7/08* (2006.01)

(52) U.S. Cl.
CPC .............. *G11C 7/1048* (2013.01); *G11C 7/12* (2013.01); *G11C 11/4091* (2013.01); *G11C 7/08* (2013.01); *G11C 11/4076* (2013.01); *G11C 11/4096* (2013.01); *G11C 2207/2227* (2013.01)

(58) Field of Classification Search
CPC .... G11C 7/12; G11C 11/4091; G11C 7/1048; G11C 16/26
USPC ........... 365/185.11, 185.21, 185.25, 189.011, 365/203
See application file for complete search history.

(56) References Cited

U.S. PATENT DOCUMENTS

2010/0046280 A1   2/2010  Chen et al.
2011/0002183 A1*  1/2011  Lee et al. ................. 365/203
2013/0028031 A1*  1/2013  Kowalczyk ............. 365/189.11

FOREIGN PATENT DOCUMENTS

KR   1020100134235 A   12/2010

* cited by examiner

*Primary Examiner* — Fernando Hidalgo
(74) *Attorney, Agent, or Firm* — William Park & Associates Ltd.

(57) ABSTRACT

A data input/output circuit includes a precharge voltage supply unit configured to supply a precharge voltage driven by a first internal voltage in a standby state, and supply the precharge voltage driven by a second internal voltage when an active operation is performed; and a precharge unit configured to receive the precharge voltage, precharge a first input/output line and a first inverted input/output line to a level of the first internal voltage in the standby state, and precharge the first input/output line and the first inverted input/output line by the second internal voltage when the active operation is performed.

32 Claims, 10 Drawing Sheets

DATA INPUT/OUTPUT CIRCUIT AND SEMICONDUCTOR MEMORY DEVICE INCLUDING THE SAME

CROSS-REFERENCES TO RELATED APPLICATIONS

The present application claims priority under 35 U.S.C 119(a) to Korean Patent Application No. 10-2012-0150087 filed on Dec. 20, 2012 in the Korean Intellectual Property Office, which is incorporated herein by reference in its entirety set forth in full.

BACKGROUND

1. Field of the Invention

As is well known in the art, each memory cell of a DRAM includes one cell transistor and one data storage capacitor. The memory cell configured in this way basically performs a read operation and a write operation. The read operation will be described below by exemplifying that a high level is stored in the memory cell.

2. Related Art

If a word line is activated to a voltage level higher than an external voltage, the cell transistor is turned on, and charge sharing occurs between the data storage capacitor and a bit line capacitor. A voltage gap (ΔV) is created between a bit line and an inverted bit line by the charge sharing. The voltage gap is amplified by a sensing operation of a bit line sense amplifier. Data sensed and amplified by the bit line sense amplifier is outputted to a segment input/output line and an inverted segment input/output line, is sensed and amplified again by a local sense amplifier, and is transferred to an outside by being loaded on a local input/output line and a global input/output line. Such a series of operations are referred to as a read operation.

SUMMARY

An embodiment of the present invention relates to a data input/output circuit which can reduce area consumption and can improve characteristics of data loaded on input/output lines in a read operation.

In an embodiment, a data input/output circuit includes: a precharge voltage supply unit configured to supply a precharge voltage driven by a first internal voltage in a standby state, and supply the precharge voltage driven by a second internal voltage when an active operation is performed; and a precharge unit configured to receive the precharge voltage, precharge a first input/output line and a first inverted input/output line to a level of the first internal voltage in the standby state, and precharge the first input/output line and the first inverted input/output line by the second internal voltage when the active operation is performed.

In an embodiment, a data input/output circuit includes: a control signal generation unit configured to generate a first control signal enabled in a standby state, a second control signal enabled during a period in which a read operation is performed, a third control signal enabled when data is outputted in the read operation, and a third inverted control signal, in response to an active command, a read command and a precharge command; and a precharge voltage supply unit configured to supply a precharge voltage driven by a first internal voltage in the standby state, and supply the precharge voltage driven by a second internal voltage when an active operation is performed, in response to the first and second control signals.

In an embodiment, a semiconductor memory device includes: a cell block including a plurality of memory cells; a word line driver positioned adjacent to the cell block in a first direction, and configured to drive a word line for accessing a memory cell included in the cell block; a sense amplifier positioned adjacent to the cell block in a second direction, and configured to sense and amplify a first input/output line and a first inverted input/output line on which data outputted from the accessed memory cell is loaded, in response to an output select signal in a read operation; and a data input/output circuit positioned adjacent to the word line driver in the second direction and is adjacent to the sense amplifier in the first direction, and configured to transfer the data loaded on the first input/output line and the first inverted input/output line to a second input/output line and a second inverted input/output line, wherein the data input/output circuit precharges the first input/output line and the first inverted input/output line by a level of a first internal voltage in a standby state, and precharges the first input/output line and the first inverted input/output line by a second internal voltage when an active operation is performed.

In an embodiment, a data input/output circuit includes a precharge voltage supply unit configured to supply a precharge voltage with a first internal voltage when a first control signal is at a logic high level, and supply the precharge voltage with a second internal voltage when the first control signal and a second control signal are at a logic low level; and a precharge unit configured to precharge a first input/output line and a first inverted input/output line with the precharge voltage when the second control signal is at a logic high level.

In an embodiment, a memory system includes a memory controller and a semiconductor memory device including a data input/output circuit. The data input/output circuit comprises: a precharge voltage supply unit configured to supply a precharge voltage driven by a first internal voltage in a standby state, and supply the precharge voltage driven by a second internal voltage when an active operation is performed; and a precharge unit configured to receive the precharge voltage, precharge a first input/output line and a first inverted input/output line to a level of the first internal voltage in the standby state, and precharge the first input/output line and the first inverted input/output line by the second internal voltage when the active operation is performed.

In an embodiment, an electronic device includes a memory system communicatively coupled to a central processing unit. The memory system includes a semiconductor memory device, wherein the semiconductor memory device comprises: a precharge voltage supply unit configured to supply a precharge voltage driven by a first internal voltage in a standby state, and supply the precharge voltage driven by a second internal voltage when an active operation is performed; and precharge unit configured to receive the precharge voltage, precharge a first input/output line and a first inverted input/output line to a level of the first internal voltage in the standby state, and precharge the first input/output line and the first inverted input/output line by the second internal voltage when the active operation is performed.

BRIEF DESCRIPTION OF THE DRAWINGS

The above and other aspects, features and other advantages will be more clearly understood from the following detailed description taken in conjunction with the accompanying drawings, in which.

DETAILED DESCRIPTION

Hereinafter, embodiments of the present invention will be described with reference to accompanying drawings. However, the embodiments are for illustrative purposes only and are not intended to limit the scope of the invention.

Figure 1:
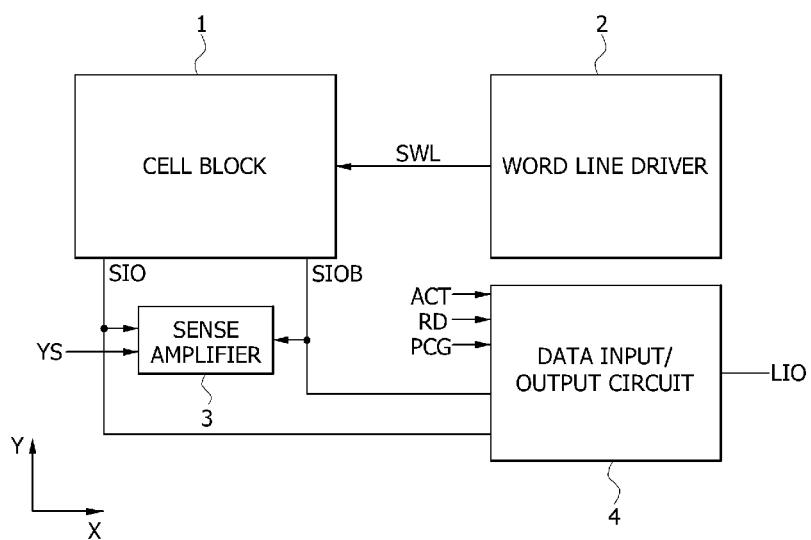
FIG. 1 is a block diagram showing the configuration of a semiconductor memory device in accordance with an embodiment of the present invention.

FIG. 1 is a block diagram showing the configuration of a semiconductor memory device in accordance with an embodiment of the present invention.

Referring to FIG. 1, a semiconductor memory device in accordance with an embodiment of the present invention may include a cell block 1, a word line driver 2, a sense amplifier 3, and a data input/output circuit 4.

The cell block 1 may include a plurality of memory cells. The word line driver 2 may drive a word line SWL to access a memory cell included in the cell block 1. The cell block 1 may output the data stored in the accessed memory cell, to a first input/output line SIO and a first inverted input/output line SIOB. The word line driver 2 may be positioned at a region which is adjacent to the cell block 1 in the X direction. While it is the norm that a plurality of first input/output lines SIO and a plurality of first inverted input/output lines SIOB, through which data are outputted from the cell block 1, are provided, only a pair of input/output lines are shown in an embodiment for the sake of convenience in explanation.

The sense amplifier 3 may be driven in response to an output select signal YS which is enabled when data is outputted in a read operation; and may sense and amplify the data of the first input/output line SIO and the first inverted input/output line SIOB. The sense amplifier 3 may be positioned at a region which is adjacent to the cell block 1 in the Y direction. While it is the norm that the sense amplifier 3 and the output select signal YS may be provided by the number of pairs of input/output lines through which data are outputted from the cell block 1; only the sense amplifier 3 driven by one output select signal YS is shown in an embodiment for the sake of convenience in explanation.

The data input/output circuit 4 may precharge the first input/output line SIO and the first inverted input/output line SIOB with different internal voltages in a standby state and during a period in which an active operation is performed in response to an active command ACT, a read command RD, and a precharge command PCG. Also, the data input/output circuit 4 may constantly retain the potential of an input/output line between the first input/output line SIO and the first inverted input/output line SIOB; which may not be driven to a low level as data is transferred, during the period in which data is outputted in the read operation. The data input/output circuit 4 may be positioned at a region which may be adjacent to the word line driver 2 in the Y direction and may be adjacent to the sense amplifier 3 in the X direction.

Figure 2:
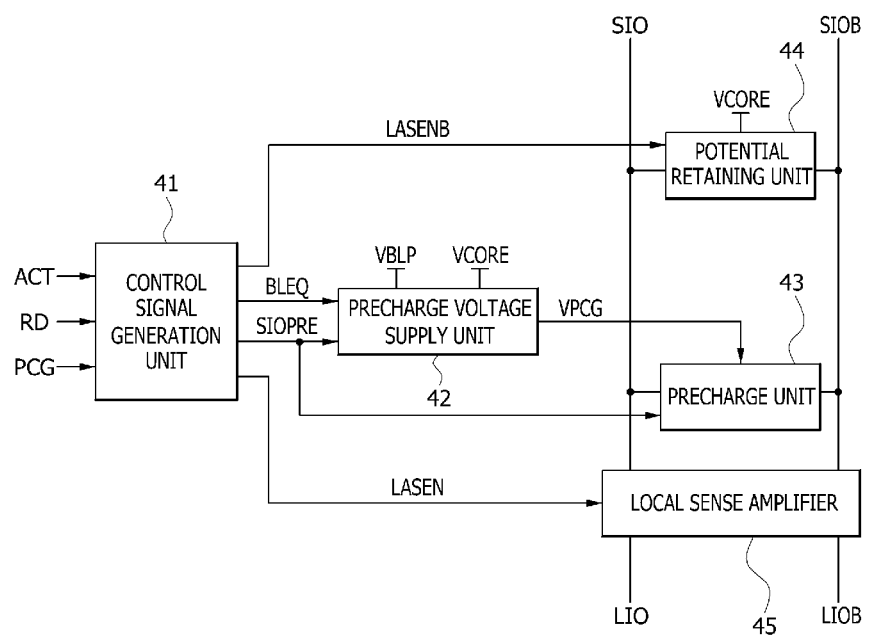
FIG. 2 is a block diagram showing the configuration of the data input/output circuit included in the semiconductor memory device shown in FIG. 1.

FIG. 2 is a block diagram showing the configuration of the data input/output circuit 4.

Referring to FIG. 2, the data input/output circuit 4 according to an embodiment may be constituted by a control signal generation unit 41, a precharge voltage supply unit 42, a precharge unit 43, a potential retaining unit 44, and a local sense amplifier 45.

The control signal generation unit 41 may receive the active command ACT, the read command RD, and the precharge command PCG; and may generate a first control signal BLEQ, a second control signal SIOPRE, a third control signal LASENB, and a third inverted control signal LASENB. The first control signal BLEQ may be disabled to a logic low level in synchronization with the active command ACT, and may be enabled to a logic high level in synchronization with the precharge command PCG. That is to say, the first control signal BLEQ may be enabled to the logic high level in the standby state, and may be disabled to the logic low level during a period in which the active operation and the read operation are performed. The second control signal SIOPRE may be enabled to a logic high level in synchronization with the read command RD, and may maintain the enabled state for a preset period. That is to say, the second control signal SIOPRE may maintain the state enabled to the logic high level during the period in which the read operation is performed. The period in which the read operation is performed may be set to include a period in which data according to the read operation is outputted. The third control signal LASEN may be enabled to a logic high level during the period in which data according to the read operation is outputted; and the third inverted control signal LASENB may be enabled to a logic low level during the period in which data according to the read operation is outputted. A detailed configuration and operations of the control signal generation unit 41 will be described later with reference to FIG. 3.

The precharge voltage supply unit 42 may drive a precharge voltage VPCG with a first internal voltage VBLP in the case where the first control signal BLEQ may be enabled to the logic high level. The precharge voltage supply unit 42 may drive the precharge voltage VPCG with a second internal voltage VCORE in the case where the first control signal BLEQ is disabled to the logic low level and the second control signal SIOPRE is disabled to the logic low level. In other words, the precharge voltage supply unit 42 may drive the precharge voltage VPCG with the first internal voltage VBLP in the standby state; and may drive the precharge voltage VPCG with the second internal voltage VCORE when the active operation is performed. The second internal voltage VCORE is a voltage which may be supplied to the core region of the cell block 1 in which memory cells are formed; and the first internal voltage VBLP may be set to one half level of the second internal voltage VCORE. The precharge voltage supply unit 42 may interrupt driving of the precharge voltage VPCG during the period in which the second control signal SIOPRE is enabled to the logic high level, that is, the period in which the read operation is performed. A detailed configuration and operations of the precharge voltage supply unit 42 will be described later with reference to FIG. 4.

The precharge unit 43 may precharge the first input/output line SIO and the first inverted input/output line SIOB with the precharge voltage VPCG during the period in which the second control signal SIOPRE is enabled to the logic high level, that is, the period in which the read operation is performed. In detail, the precharge unit 43 may precharge the first input/output line SIO and the first inverted input/output line SIOB with the first internal voltage VBLP in the standby state; and may precharge the first input/output line SIO and the first inverted input/output line SIOB with the second internal voltage VCORE during the period in which the read operation is performed. A detailed configuration and operations of the precharge unit 43 will be described later with reference to FIG. 5.

The potential retaining unit 44 may retain the potential of the first input/output line SIO or the first inverted input/output line SIOB as the second internal voltage VCORE when the third inverted control signal LASENB is enabled to the logic low level, that is, during the period in which data is outputted in the read operation. For example, in the case where data of a logic low level is loaded on the first input/output line SIO so the first input/output line SIO is driven to a level lower than the second internal voltage VCORE; the potential of the first inverted input/output line SIOB may be retained as the second internal voltage VCORE. When the data of the logic low level is loaded on the first input/output line SIO, the potential of the first inverted input/output line SIOB may not be lowered under the influence of the first input/output line SIO; and may be retained as the second internal voltage VCORE by the potential retaining unit 44, and this, it is possible to prevent characteristics of data from be degraded. A detailed configuration and operation of the potential retaining unit 44 will be described later with reference to FIG. 6.

The local sense amplifier 45 may sense and amplify the data of the first input/output line SIO and the first inverted input/output line SIOB; and may transfer the sensed and amplified data to a second input/output line LIO and a second inverted input/output line LIOB. A detailed configuration and operations of the local sense amplifier 45 will be described later with reference to FIG. 7.

Figure 3:
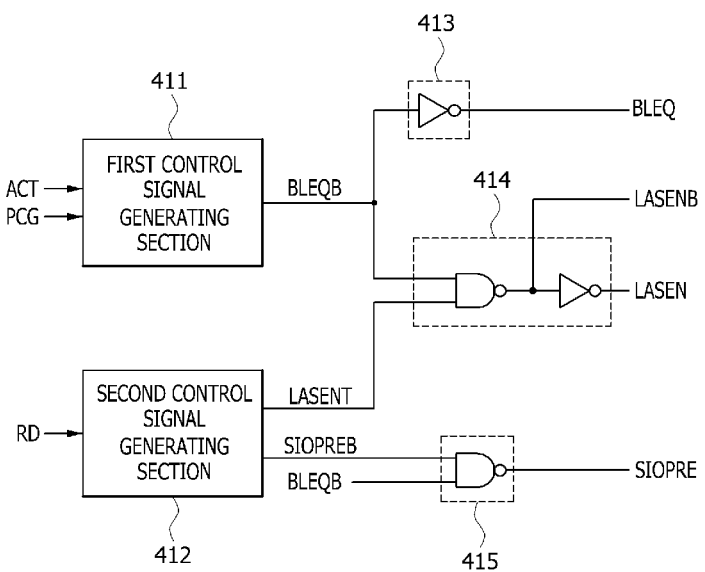
FIG. 3 is a diagram showing an embodiment of the control signal generation unit included in the data input/output circuit shown in FIG. 2.

FIG. 3 is a diagram showing an embodiment of the control signal generation unit 41.

Referring to FIG. 3, the control signal generation unit 41 according to an embodiment may include a first control signal generating section 411, a second control signal generating section 412, an inversion buffer section 413, a first buffer section 414, and a second buffer section 415. The first control signal generating section 411 may generate a first inverted control signal BLEQB which is disabled to a logic high level in synchronization with the active command ACT; and may be enabled to a logic low level in synchronization with the precharge command PCG. The second control signal generating section 412 may generate a second inverted control signal SIOPREB which is enabled to a logic low level in synchronization with the read command RD; and may retain the enabled state during the period in which the read operation is performed. Further, the second control signal generating section 412 may generate a preliminary control signal LASENT which retains a state enabled to a logic high level when data output is performed during the period in which the read operation is performed. The inversion buffer section 413 may inversion-buffer the first inverted control signal BLEQB and may generate the first control signal BLEQ which is enabled to the logic high level in the standby state. The first buffer section 414 may generate the third inverted control signal LASENB by inversion-buffering the preliminary control signal LASENT with the first inverted control signal BLEQB disabled to the logic high level; and may generate the third control signal LASEN by inversion-buffering the third inverted control signal LASENB. The second buffer section 415 may generate the second control signal SIOPRE by inversion-buffering the second inverted control signal SIOPREB with the first inverted control signal BLEQB disabled to the logic high level. In summary, the first control signal BLEQ generated by the control signal generation unit 41 may be enabled to the logic high level in the standby state; the second control signal SIOPRE may be enabled to the logic high level when the read operation is performed; and the third control signal LASEN and the third inverted control signal LASENB may be enabled to the logic high level and the logic low level, respectively, when data is outputted in the read operation.

Figure 4:
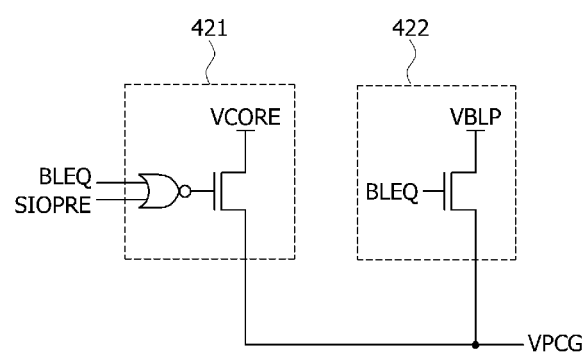
FIG. 4 is a diagram showing an embodiment of the precharge voltage supply unit included in the data input/output circuit shown in FIG. 2.

FIG. 4 is a diagram showing an embodiment of the precharge voltage supply unit 42.

Referring to FIG. 4, the precharge voltage supply unit 42 according to an embodiment may be constituted by a first driving section 421 and a second driving section 422. The first driving section 421 may drive the precharge voltage VPCG with the second internal voltage VCORE in the case where both the first control signal BLEQ and the second control signal SIOPRE are disabled to the logic low levels. The second driving section 422 may drive the precharge voltage VPCG with the first internal voltage VBLP in the case where the first control signal BLEQ is enabled to the logic high level. In summary, the precharge voltage supply unit 42 may drive the precharge voltage VPCG with the first internal voltage VBLP in the standby state; and may drive the precharge voltage VPCG with the second internal voltage VCORE during the period in which the active operation is performed.

Figure 5:
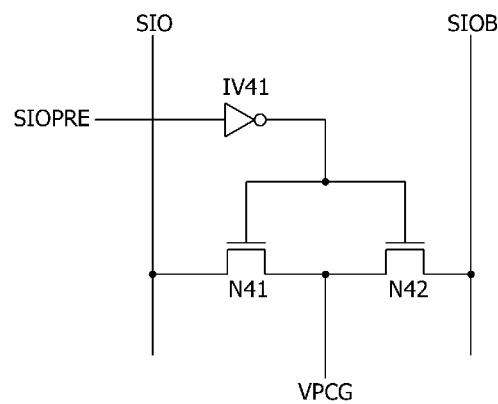
FIG. 5 is a diagram showing an embodiment of the precharge unit included in the data input/output circuit shown in FIG. 2.

FIG. 5 is a diagram showing an embodiment of the precharge unit 43.

Referring to FIG. 5, the precharge unit 43 according to an embodiment may be constituted by an inverter IV41 which may inversion-buffer the second control signal SIOPRE; and NMOS transistors N41 and N42 which may be turned on according to the output signal of the inverter IV41 and may supply the precharge voltage VPCG to the first input/output line SIO and the first inverted input/output line SIOB. The precharge unit 43 may precharge the first input/output line SIO and the first inverted input/output line SIOB with the first internal voltage VBLP in the standby state; and may precharge the first input/output line SIO and the first inverted input/output line SIOB with the second internal voltage VCORE when the read operation is performed.

Figure 6:
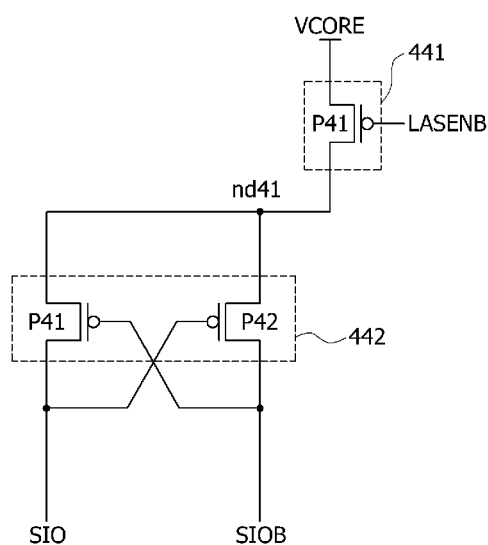
FIG. 6 is a diagram showing an embodiment of the potential retaining unit included in the data input/output circuit shown in FIG. 2.

FIG. 6 is a diagram showing an embodiment of the potential retaining unit 44.

Referring to FIG. 6, the potential retaining unit 44 according to an embodiment may be constituted by a voltage supply section 441 and a select switch section 442. The voltage supply section 441 may be constituted by a PMOS transistor P41 which may be turned on when the third inverted control signal LASENB is enabled to the logic low level and may supply the second internal voltage VCORE to a node nd41. The select switch section 442 may be constituted by PMOS transistors P41 and P42 which may be selectively turned on according to the levels of the first input/output line SIO and the first inverted input/output line SIOB. The potential retaining unit 44 configured in this way may retain the potential of the first input/output line SIO or the first inverted input/output line SIOB as the second internal voltage VCORE when data is outputted in the read operation. For example, in the case where data of a logic low level may be loaded on the first input/output line SIO so the first input/output line SIO may be driven to a level lower than the second internal voltage VCORE, the potential of the first inverted input/output line SIOB may be retained as the second internal voltage VCORE.

Figure 7:
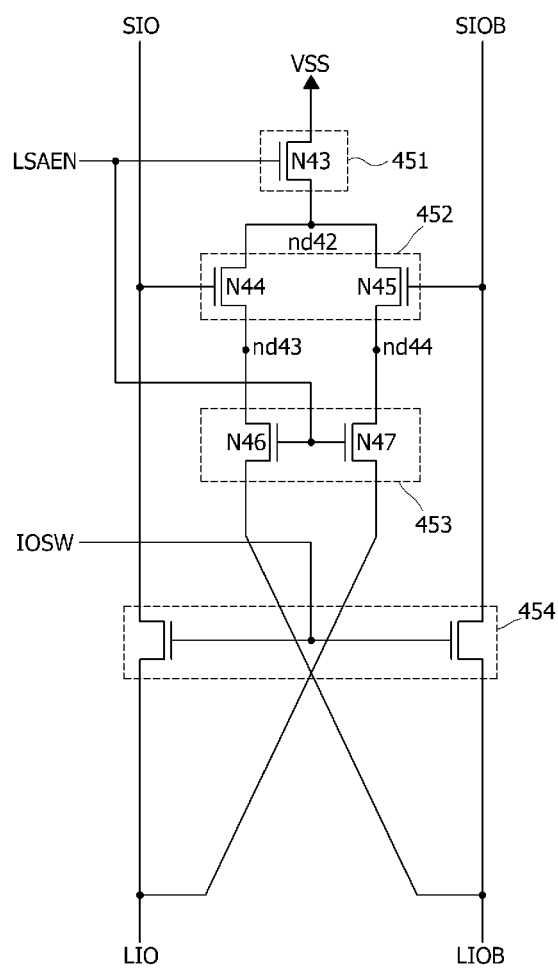
FIG. 7 is a diagram showing an embodiment of the local sense amplifier included in the data input/output circuit shown in FIG. 2.

FIG. 7 is a diagram showing an embodiment of the local sense amplifier 45.

Referring to FIG. 7, the local sense amplifier 45 according to an embodiment may be constituted by an enable section 451, an input section 452, a current mirror section 453, and an input/output switch section 454. The enable section 451 may include an NMOS transistor N43 which provides a path to ground VSS, and which may be turned on during a period in which the third control signal LASEN is enabled to the logic high level. The input section 452 may include NMOS transistors N44 and N45 which may be turned on by receiving the signal of the first input/output line SIO or the first inverted input/output line SIOB. The input section 452 may also determine the potentials of nodes nd42, nd43, and nd44. The current mirror section 453 may include NMOS transistors N46 and N47 which may be turned on by receiving the third control signal LASEN through the gates thereof; and may operate as a current source which supplies the same current to the nodes nd42, nd43, and nd44. The input/output switch section 454 may transfer the data of the first input/output line SIO or the first inverted input/output line SIOB to the second input/output line LIO or the second inverted input/output line LIOB when an input/output switching signal IOSW is enabled to a logic high level. The local sense amplifier 45 may sense and amplify the data of the first input/output line SIO or the first inverted input/output line SIOB during the period in which data is outputted in the read operation. The local sense amplifier may also transfer the sensed and amplified data of the first input/output line SIO or the first inverted input/output line SIOB to the second input/output line LIO or the second inverted input/output line LIOB when the input/output switching signal IOSW is enabled.

Figure 8:
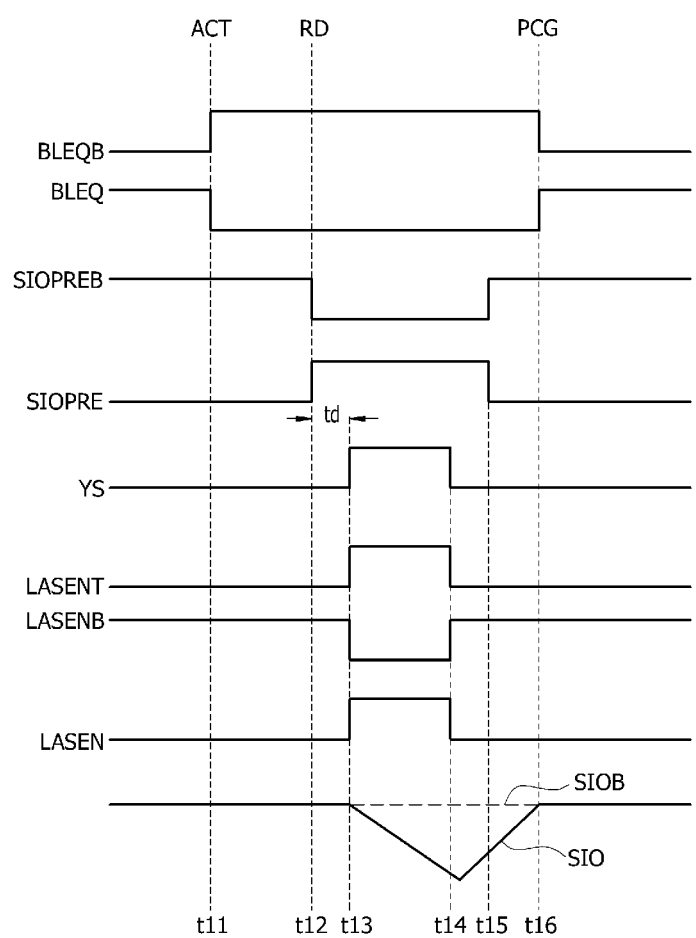
FIG. 8 is a timing diagram explaining operations of the data input/output circuit shown in FIG. 2.

Operations of the data input/output circuit 4 configured as mentioned above will be described below with reference to FIG. 8, by being divided into the standby state, the period in which the active operation is performed and the period in which data is outputted during the read operation.

In a period before a time t11 at which the active command ACT is inputted, that is, in the standby state, the first control signal BLEQ may be enabled to the logic high level. Accordingly, as the precharge voltage VPCG may be driven by the first internal voltage VBLP, the first input/output line SIO and the first inverted input/output line SIOB may be precharged with the first internal voltage VBLP.

In a period from the time t11 at which the active command ACT may be inputted to a time t12 at which the read command RD may be inputted, that is, during the period in which the active operation is performed, the first control signal BLEQ and the second control signal SIOPRE may be disabled to the logic low levels. Accordingly, as the precharge voltage VPCG may be driven by the second internal voltage VCORE, the first input/output line SIO and the first inverted input/output line SIOB may be precharged with the second internal voltage VCORE.

In a period from the time t12 at which the read command RD may be inputted to a time t15, that is, when the read operation is performed, since the second control signal SIO-PRE may be enabled to the logic high level, the precharge voltage VPCG is not driven; and precharge of the first input/output line SIO and the first inverted input/output line SIOB may be interrupted. A time interval td between the time t12 and the time t13 may be included within the period when the read command RD is inputted and when the read operation is performed. During the period in which data is outputted in the read operation, that is, in a period from a time t13 to a time t14, the third control signal LASEN may be enabled to the logic high level; and the third inverted control signal LASENB may be enabled to the logic low level. Accordingly, when the data of the logic low level is loaded on the first input/output line SIO, the potential of the first inverted input/output line SIOB may not be lowered under the influence of the first input/output line SIO; and may be retained as the second internal voltage VCORE by the potential retaining unit 44. Also, the local sense amplifier 45 may sense and amplify the data of the first input/output line SIO or the first inverted input/output line SIOB; and may transfer the sensed and amplified data to the second input/output line LIO or the second inverted input/output line LIOB.

In a period from the time t15 to a time t16 at which the precharge command PCG may be inputted, the first control signal BLEQ and the second control signal SIOPRE may be disabled to the logic low levels. Accordingly, as the precharge voltage VPCG may be driven by the second internal voltage VCORE, the first input/output line SIO and the first inverted input/output line SIOB may be precharged with the second internal voltage VCORE.

In a period after the time t16 at which the precharge command PCG may be inputted, the standby state may be entered again, and the first control signal BLEQ may be enabled to the logic high level. Accordingly, as the precharge voltage VPCG may be driven by the first internal voltage VBLP, the first input/output line SIO and the first inverted input/output line SIOB may be precharged with the first internal voltage VBLP.

As described above, the data input/output circuit 4 included in the semiconductor memory device according to an embodiment may be realized in such a way as to selectively drive the precharge voltage VPCG in the standby state; and during the period in which the read operation is performed, to thereby precharge the first input/output line SIO and the first inverted input/output line SIOB, whereby the configuration of a circuit for precharge may be simplified. Accordingly, the data input/output circuit 4 included in the semiconductor memory device according to an embodiment may reduce an area which may needed to configure a circuit to precharge the first input/output line SIO and the first inverted input/output line SIOB. Moreover, the data input/output circuit 4 included in the semiconductor memory device according to an embodiment may retain a line on which data may not be loaded when the data of the logic low level may be loaded on the first input/output line SIO; or the first inverted input/output line SIOB as the second internal voltage VCORE, whereby the characteristics of data may be improved.

Figure 9:
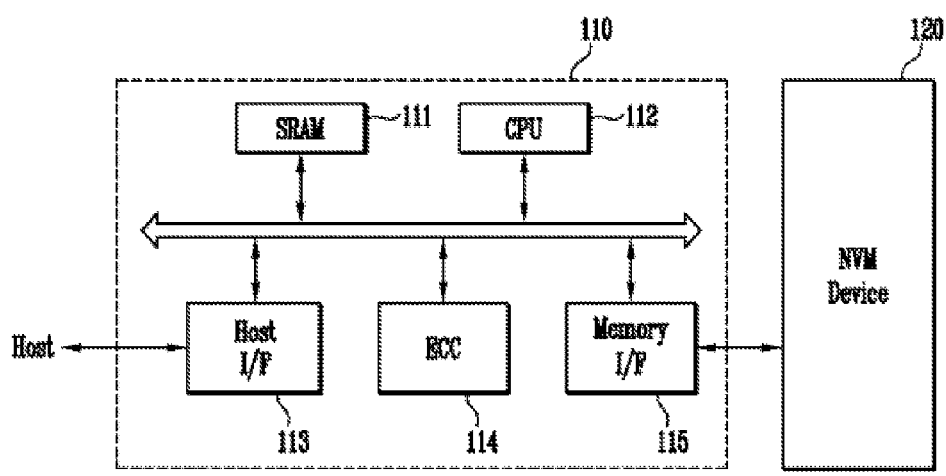
FIG. 9 is an embodiment showing a block diagram of the memory system.

FIG. 9 is a block diagram illustrating a memory system according to an embodiment of the present invention.

In FIG. 9, the memory system 100 of an embodiment of the present invention may include a semiconductor memory device 120, a memory controller 110, and a CPU 112.

The semiconductor memory device 120 may serve as a volatile memory device such as a DRAM or a nonvolatile memory device such as MRAM, STT-MRAM, PCRAM, ReRAM, or FeRAM. The semiconductor memory device 120 may be a multi-chip package having flash memory chips.

The memory controller 110 may control the semiconductor memory device 120, and may include an SRAM 111, a host interface 113, an Error-Correction Code Block (ECC) 864, and a memory interface 115. The SRAM 111 may be used as an operation memory of the CPU 112, the CPU 112 may perform control operation for data exchange for the memory controller 110, and the host interface 113 may have data exchange protocol of a host accessed to the memory system 100. The ECC 114 may detect and correct error of data read from the semiconductor memory device 120, and the memory interface 115 may interface with the semiconductor memory device 120. The memory controller 110 may include further ROM for storing data for interfacing with the host, etc.

The memory system 100 may be used as a memory card or a solid state disk (SSD) by combination of the semiconductor memory device 120 and the memory controller 110. In the event that the memory system 100 is the SSD, the memory controller 110 may communicate with an external device, e.g. host through one of various interface protocols such as USB, MMC, PCI-E, SATA, PATA, SCSI, ESDI, IDE, etc.

Figure 10:
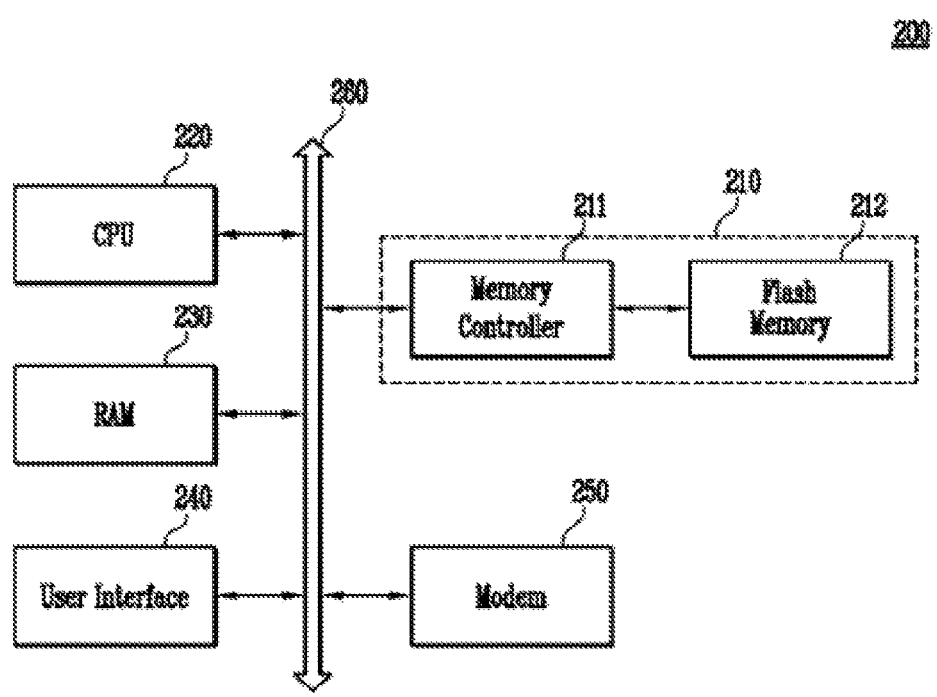
FIG. 10 is an embodiment showing a view of an electronic device or a computing system.

FIG. 10 is a view illustrating an electronic device or a computing system according to an embodiment of the present invention.

In FIG. 10, the computing system 200 of various embodiments of the present invention may include a CPU 220 connected to a system bus 260, a RAM 230, an output device 240 or a user interface, an input device 250, and a memory system 210 including a memory controller 211 and a semiconductor memory device 212. In the case that the computing system 201 is a mobile device, a battery (not shown) for supplying an operation voltage to the computing system 200 may be further provided. The computing system 200 of the present invention may further include an application chipset, a CMOS image processor CIS, a mobile DRAM, etc.

The output device or user interface 240 may be a self-contained display in the case of a portable electronic device. The input device or modem 250 may be a physical keyboard or a virtual keyboard in the case of a portable electronic device such as i.e. a smartphone, tablet pc, labtop, etc. The portable electronic device may further include, without limitation, a trackball, touchpad, or other cursor control device combined with a selection control, such as a pushbutton, to select an item highlighted by cursor manipulation. The memory system 210 may include a semiconductor memory device as described in FIG. 9.

As is apparent from the above descriptions, according to an embodiment of the present invention, it may be possible to reduce an area needed for a configuration to precharge input/output lines.

Also, according to an embodiment of the present invention, it may be possible to improve characteristics of data loaded on input/output lines in a read operation.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A data input/output circuit comprising:
   a precharge voltage supply unit configured to supply a precharge voltage driven by a first internal voltage in a standby state, and supply the precharge voltage driven by a second internal voltage in response to a first and second control signals when an active operation is performed; and
   a precharge unit configured to receive the precharge voltage, precharge a first input/output line and a first inverted input/output line to a level of the first internal voltage in the standby state, and precharge the first input/output line and the first inverted input/output line by the second internal voltage when the active operation is performed, wherein the first control signal is disabled during a period in which the active operation and a read operation are performed, and the second control signal is enabled during the period in which the read operation is performed.

2. The data input/output circuit according to claim 1, wherein a level of the second internal voltage is set to be two times higher than the level of the first internal voltage.

3. The data input/output circuit according to claim 1, wherein the precharge voltage supply unit interrupts driving of the precharge voltage during a period in which a read operation is performed.

4. The data input/output circuit according to claim 3, wherein the precharge voltage supply unit comprises:
   a first driving section configured to drive the precharge voltage by the second internal voltage in response to the first control signal and the second control signal; and
   a second driving section configured to drive the precharge voltage by the first internal voltage in response to the first control signal.

5. The data input/output circuit according to claim 4, wherein the first driving section drives the precharge voltage by the second internal voltage during a period in which the first and second control signals are disabled.

6. The data input/output circuit according to claim 4, wherein the second driving section drives the precharge voltage by the first internal voltage during a period in which the first control signal is enabled.

7. The data input/output circuit according to claim 4, further comprising:
   a control signal generation unit configured to generate the first control signal, the second control signal, a third control signal which is enable during a period in which data is outputted, and a third inverted control signal, in response to an active command, a read command and a precharge command.

8. The data input/output circuit according to claim 7, wherein the control signal generation unit comprises:
   a first control signal generating section configured to generate a first inverted control signal which is enabled in synchronization with the active command and is disabled in synchronization with the precharge command; and
   a second control signal generating section configured to generate a second inverted control signal which is enabled during the period in which the read operation is performed and a preliminary control signal which is enabled during a period in which data is outputted in the read operation, in synchronization with the read command.

9. The data input/output circuit according to claim 8, wherein the control signal generation unit further comprises:
   an inversion buffer section configured to generate the first control signal by inversion-buffering the first inverted control signal;
   a first buffer section configured to generate a third inverted control signal by inversion-buffering the preliminary control signal in response to the first inverted control signal, and generate the third control signal by inversion-buffering the third inverted control signal; and
   a second buffer section configured to generate the second control signal by inversion-buffering the second inverted control signal in response to the first inverted control signal.

10. The data input/output circuit according to claim 7, further comprising:
    a potential retaining unit configured to drive the first input/output line or the first inverted input/output line by the second internal voltage in response to the third inverted control signal.

11. The data input/output circuit according to claim 10, wherein the potential retaining unit drives the first inverted input/output line by the second internal voltage in the case where a level of the first input/output line is driven to be lower than the second internal voltage during the period in which data is outputted.

12. The data input/output circuit according to claim 7, further comprising:
a local sense amplifier configured to sense and amplify signals of the first input/output line and the first inverted input/output line during the period in which data is outputted, and load the sensed and amplified signals on a second input/output line and a second inverted input/output line.

13. A data input/output circuit comprising:
a control signal generation unit configured to generate a first control signal enabled in a standby state, a second control signal enabled when a read operation is performed, a third control signal enabled when data is outputted in the read operation, and a third inverted control signal, in response to an active command, a read command and a precharge command; and
a precharge voltage supply unit configured to supply a precharge voltage driven by a first internal voltage in the standby state, and supply the precharge voltage driven by a second internal voltage when an active operation is performed, in response to the first and second control signals.

14. The data input/output circuit according to claim 13, wherein the control signal generation unit comprises:
a first control signal generating section configured to generate a first inverted control signal which is enabled in synchronization with the active command and is disabled in synchronization with the precharge command; and
a second control signal generating section configured to generate a second inverted control signal which is enabled during the period in which the read operation is performed and a preliminary control signal which is enabled during a period in which data is outputted, in synchronization with the read command.

15. The data input/output circuit according to claim 14, wherein the control signal generation unit further comprises:
an inversion buffer section configured to generate the first control signal by inversion-buffering the first inverted control signal;
a first buffer section configured to generate a third inverted control signal by inversion-buffering the preliminary control signal in response to the first inverted control signal, and generate the third control signal by inversion-buffering the third inverted control signal; and
a second buffer section configured to generate the second control signal by inversion-buffering the second inverted control signal in response to the first inverted control signal.

16. The data input/output circuit according to claim 13, wherein a level of the second internal voltage is set to be two times higher than the level of the first internal voltage.

17. The data input/output circuit according to claim 13, wherein the precharge voltage supply unit interrupts driving of the precharge voltage during a period in which a read operation is performed.

18. The data input/output circuit according to claim 17, wherein the precharge voltage supply unit comprises:
a first driving section configured to drive the precharge voltage by the second internal voltage in response to a first control signal which is disabled during a period in which the active operation and the read operation are performed and a second control signal which is enabled during the period in which the read operation is performed; and
a second driving section configured to drive the precharge voltage by the first internal voltage in response to the first control signal.

19. The data input/output circuit according to claim 18, wherein the first driving unit drives the precharge voltage by the second internal voltage during a period in which the first and second control signals are disabled.

20. The data input/output circuit according to claim 18, wherein the second driving unit drives the precharge voltage by the first internal voltage during a period in which the first control signal is enabled.

21. The data input/output circuit according to claim 13, further comprising:
a precharge unit configured to receive the precharge voltage, precharge a first input/output line and a first inverted input/output line to a level of the first internal voltage in the standby state, and precharge the first input/output line and the first inverted input/output line by the second internal voltage during the period in which the active operation is performed.

22. The data input/output circuit according to claim 21, further comprising:
a potential retaining unit configured to drive the first input/output line or the first inverted input/output line by the second internal voltage in response to the third inverted control signal.

23. The data input/output circuit according to claim 22, wherein the potential retaining unit drives the first inverted input/output line by the second internal voltage in the case where a level of the first input/output line is driven to be lower than the second internal voltage during the period in which data is outputted.

24. The data input/output circuit according to claim 21, further comprising:
a local sense amplifier configured to sense and amplify signals of the first input/output line and the first inverted input/output line during the period in which data is outputted, and load the sensed and amplified signals on a second input/output line and a second inverted input/output line.

25. A semiconductor memory device comprising:
a cell block including a plurality of memory cells;
a word line driver positioned adjacent to the cell block in a first direction, and configured to drive a word line for accessing a memory cell included in the cell block;
a sense amplifier positioned adjacent to the cell block in a second direction, and configured to sense and amplify a first input/output line and a first inverted input/output line on which data outputted from the accessed memory cell is loaded, in response to an output select signal in a read operation; and
a data input/output circuit positioned adjacent to the word line driver in the second direction and adjacent to the sense amplifier in the first direction, and configured to transfer the data loaded on the first input/output line and the first inverted input/output line to a second input/output line and a second inverted input/output line,
wherein the data input/output circuit precharges the first input/output line and the first inverted input/output line by a level of a first internal voltage in a standby state, and precharges the first input/output line and the first inverted input/output line by a second internal voltage in response to a first and second control signals when an active operation is performed, the first control signal is disabled during a period in which the active operation and a read operation are performed, and the second control signal is enabled during the period in which the read operation is performed.

26. The semiconductor memory device according to claim 25, wherein the data input/output circuit comprises:
   a precharge voltage supply unit configured to supply a precharge voltage driven by the first internal voltage in the standby state, and supply a precharge voltage driven by the second internal voltage during the period in which the active operation is performed; and
   a precharge unit configured to receive the precharge voltage, precharge the first input/output line and the first inverted input/output line to the level of the first internal voltage in the standby state, and precharge the first input/output line and the first inverted input/output line by the second internal voltage during the period in which the active operation is performed.

27. The semiconductor memory device according to claim 26, wherein the precharge voltage supply unit comprises:
   a first driving section configured to drive the precharge voltage by the second internal voltage in response to the first control signal and the second control signal; and
   a second driving section configured to drive the precharge voltage by the first internal voltage in response to the first control signal.

28. The semiconductor memory device according to claim 26, wherein the data input/output circuit further comprises:
   a control signal generation unit configured to generate the first control signal, the second control signal, a third control signal which is enable during a period in which data is outputted in the read operation, and a third inverted control signal, in response to an active command, a read command and a precharge command.

29. The semiconductor memory device according to claim 28, wherein the control signal generation unit comprises:
   a first control signal generating section configured to generate a first inverted control signal which is enabled in synchronization with the active command and is disabled in synchronization with the precharge command; and
   a second control signal generating section configured to generate a second inverted control signal which is enabled during the period in which the read operation is performed and a preliminary control signal which is enabled during a period in which data is outputted in the read operation, in synchronization with the read command.

30. The semiconductor memory device according to claim 29, wherein the control signal generation unit further comprises:
   an inversion buffer section configured to generate the first control signal by inversion-buffering the first inverted control signal;
   a first buffer section configured to generate a third inverted control signal by inversion-buffering the preliminary control signal in response to the first inverted control signal, and generate the third control signal by inversion-buffering the third inverted control signal; and
   a second buffer section configured to generate the second control signal by inversion-buffering the second inverted control signal in response to the first inverted control signal.

31. The semiconductor memory device according to claim 28, wherein the data input/output circuit further comprises:
   a potential retaining unit configured to drive the first input/output line or the first inverted input/output line by the second internal voltage in response to the third inverted control signal.

32. The semiconductor memory device according to claim 26, wherein the data input/output circuit further comprises:
   a local sense amplifier configured to sense and amplify signals of the first input/output line and the first inverted input/output line during the period in which data is outputted in the read operation, and load the sensed and amplified signals on a second input/output line and a second inverted input/output line.

* * * * *